United States Patent
Yang et al.

(10) Patent No.: US 9,620,493 B2
(45) Date of Patent: Apr. 11, 2017

(54) METHOD OF MANUFACTURING THREE-DIMENSIONAL SEMICONDUCTOR CHIP

(71) Applicant: RESEARCH & BUSINESS FOUNDATION SUNGKYUNKWAN UNIVERSITY, Suwon-si (KR)

(72) Inventors: Joonsung Yang, Seongnam-si (KR); Soonkwan Kwon, Goyang-si (KR)

(73) Assignee: Research & Business Foundation Sungkyunkwan University, Suwon-si (KR)

(*) Notice: Subject to any disclaimer, the term of this patent is extended or adjusted under 35 U.S.C. 154(b) by 49 days.

(21) Appl. No.: 14/747,519

(22) Filed: Jun. 23, 2015

(65) Prior Publication Data

US 2015/0371980 A1    Dec. 24, 2015

(30) Foreign Application Priority Data

Jun. 24, 2014  (KR) .......................... 10-2014-0077544

(51) Int. Cl.
| | | |
|---|---|---|
| G06F 17/50 | (2006.01) | |
| H01L 25/00 | (2006.01) | |
| H01L 21/66 | (2006.01) | |
| H01L 25/065 | (2006.01) | |
| H01L 23/544 | (2006.01) | |

(52) U.S. Cl.
CPC .............. *H01L 25/50* (2013.01); *H01L 22/14* (2013.01); *H01L 22/20* (2013.01); *H01L 23/544* (2013.01); *H01L 25/0657* (2013.01); *H01L 25/0655* (2013.01); *H01L 2223/54406* (2013.01); *H01L 2223/54433* (2013.01); *H01L 2223/54473* (2013.01); *H01L 2924/0002* (2013.01)

(58) Field of Classification Search
USPC .......................................................... 716/56
See application file for complete search history.

(56) References Cited

U.S. PATENT DOCUMENTS

| | | | |
|---|---|---|---|
| 2007/0128827 A1* | 6/2007 | Faris | ................. H01L 21/76254 438/455 |
| 2007/0288219 A1* | 12/2007 | Zafar | ....................... G03F 1/84 703/14 |

* cited by examiner

*Primary Examiner* — Eric Lee
(74) *Attorney, Agent, or Firm* — NSIP Law

(57) ABSTRACT

A method of manufacturing a three-dimensional (3D) semiconductor includes dividing each of a plurality of wafers into a plurality of multi-dies each including a plurality of dies; checking whether each of the dies has a defect; storing a result of checking whether each of the dies has a defect and information regarding each of the multi-dies; forming virtual combined structures by combining and stacking all the multi-dies in a predetermined number of layers; forming 3D semiconductor groups by calculating yields of the combined structures based on the result of checking whether each of the dies has a defect and the information regarding each of the multi-dies, selecting a combined structure having a highest yield from among the combined structures, and stacking the multi-dies to have the same structure as the selected combined structure; and forming a 3D semiconductor chip by dividing the 3D semiconductor groups in units of dies.

8 Claims, 4 Drawing Sheets

METHOD OF MANUFACTURING THREE-DIMENSIONAL SEMICONDUCTOR CHIP

CROSS-REFERENCE TO RELATED APPLICATION

This application claims the benefit under 35 USC 119(a) of Korean Patent Application No. 10-2014-0077544, filed on Jun. 24, 2014, the entire disclosure of which is incorporated herein by reference for all purposes.

BACKGROUND

1. Field of the Invention

The present invention relates to a three-dimensional (3D) semiconductor, and more particularly, to a method of manufacturing a 3D semiconductor chip.

2. Discussion of Related Art

In recent years, semiconductor technology has been rapidly advanced. Semiconductors have been developed in smaller sizes while observing for several decades the Moore's law, stated by Gordon Moore who has been well known as the co-founder of Intel to the general public, that the number of transistors included in one chip has doubled approximately every eighteen months. Recently, semiconductor technology has been developed to manufacture semiconductors having a size of about 20 µm.

In general, semiconductor technology has been continuously developed to satisfy a demand for smaller semiconductors and the reliability of mounting semiconductors. In recent years, as there is a demand for small-sized and high-performance electric/electronic products, various semiconductor technologies employing a stacking manner have been developed.

In the semiconductor industry, the term "stacking" means stacking at least two semiconductor chips or packages in a vertical direction. When stacking is used, a semiconductor product may be manufactured to have a memory capacity that is double or more that of a semiconductor product according to the related art.

Also, stacking is advantageous in terms of an increase in a memory capacity and a mounting density and efficient use of a mounting area. Thus, research and development have been actively conducted on stacking methods.

Recently, stacking methods may be largely classified into a wafer-to-wafer (W2W) method, a die-to-wafer (D2W) method, and a die-to-Die (D2D) method.

The W2W method has a problem that a yield decreases as the number of stacked layers increases. The D2D method has a problem that only one semiconductor chip can be manufactured since stacking is performed once, but it has a high yield.

SUMMARY OF THE INVENTION

The present invention is directed to a method of manufacturing a three-dimensional (3D) semiconductor by dividing one wafer into several parts and stacking the several parts, thereby increasing both a throughput and yield of manufacturing a 3D semiconductor chip.

According to an aspect of the present invention, a method of manufacturing a three-dimensional (3D) semiconductor chip includes dividing each of a plurality of wafers into a plurality of multi-dies each including a plurality of dies; checking whether each of the dies has a defect; storing a result of checking whether each of the dies has a defect and information regarding each of the multi-dies; forming virtual combined structures by combining and stacking all the multi-dies in a predetermined number of layers; forming 3D semiconductor groups by calculating yields of the combined structures based on the result of checking whether each of the dies has a defect and the information regarding each of the multi-dies, selecting a combined structure having a highest yield from among the combined structures, and stacking the multi-dies to have the same structure as the selected combined structure; and forming a 3D semiconductor chip by dividing the 3D semiconductor groups in units of dies.

In one embodiment, the multi-dies each may have a tetragonal shape and a top surface, and the top surface may include a first corner extending in a first direction and a second corner extending in a second direction perpendicular to the first direction.

In one embodiment, the multi-dies may be stacked such that the first and second corners of the multi-dies are arranged to be parallel to each other.

In one embodiment, the dividing of each of the plurality of wafers into the plurality of multi-dies may include dividing each of the plurality of wafers such that the multi-dies have the same number of dies and the same shape and size.

In one embodiment, a location of at least one die with a defect may be marked on each of the multi-dies as the result of checking whether each of the dies has a defect.

In one embodiment, the information regarding each of the multi-dies may include an identification number of a wafer from which each of the plurality of multi-dies is separated; and an identification number of a location on the wafer from which each of the multi-dies is separated.

A lot number is a mark assigned to products that are formed of the same material and are thus considered to have characteristics. Some of products assigned the same lot number may be selected and tested, and all the products assigned the same lot number may be tested when a defective product is detected from among the tested products. The information regarding each of the multi-dies may further include a lot number of the wafer from which each of the multi-dies is separated.

In one embodiment, a number of the plurality of multi-dies divided from each of the plurality of wafers may be four or more.

In one embodiment, the predetermined number of layers may be two or more.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Figure 1:
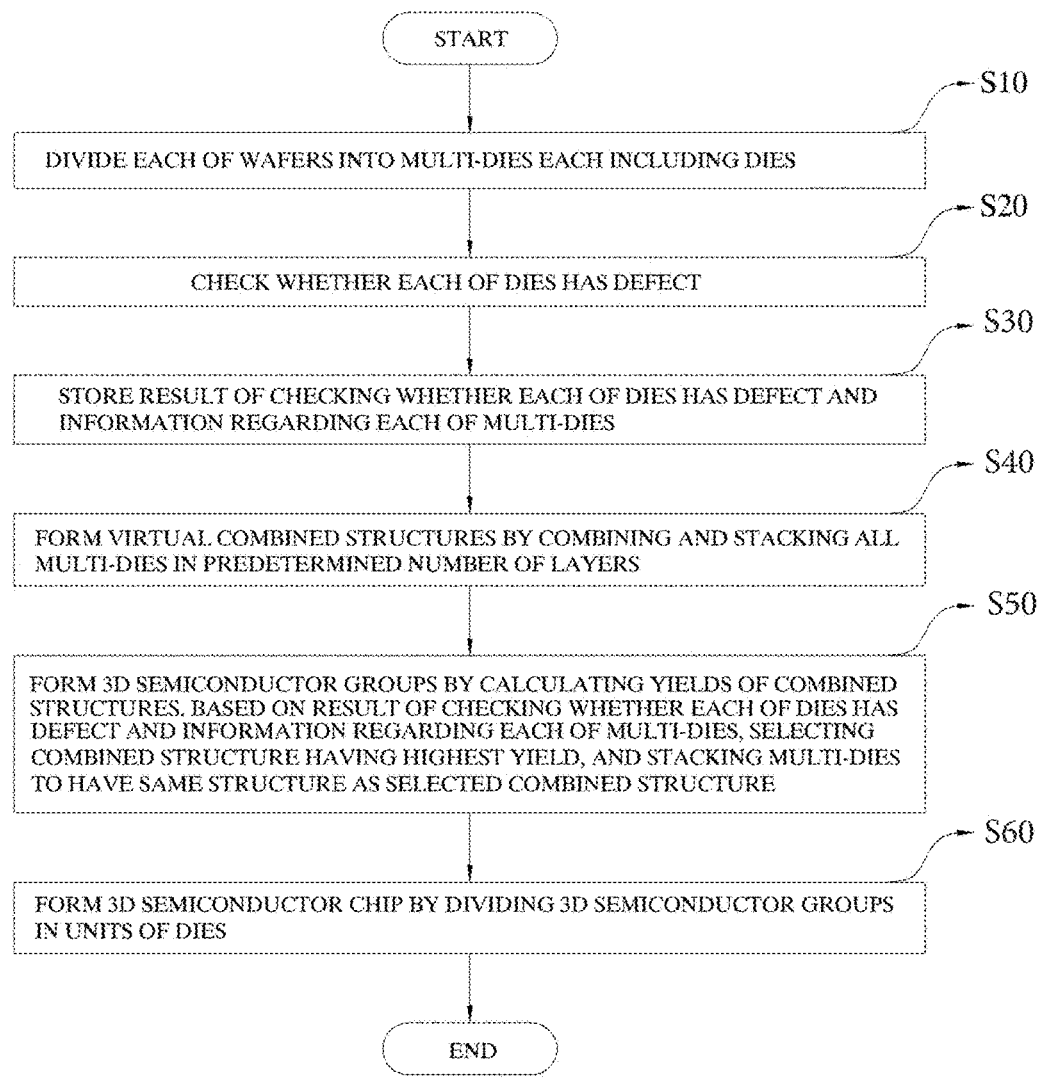
FIG. 1 is a flowchart of a method of manufacturing a three-dimensional (3D) semiconductor chip according to an exemplary embodiment of the present invention.

The present invention may be embodied in many different forms and accomplished in various embodiments. Thus, exemplary embodiments of the present invention will be illustrated in the drawings and described in detail in the detailed description. However, the present invention is not limited to these exemplary embodiments, and it would be appreciated by those of ordinary skill in the art that changes may be made in these exemplary embodiments without departing from the principles and spirit of the invention, the scope of which is defined in the claims and their equivalents.

Hereinafter, exemplary embodiments of the present invention will be described in detail with reference to the accompanying drawings. The same reference numerals represent the same elements throughout the drawings.

FIG. 1 is a flowchart of a method of manufacturing a three-dimensional (3D) semiconductor chip according to an exemplary embodiment of the present invention.

Referring to FIG. 1, the method of manufacturing a 3D semiconductor chip according to an exemplary embodiment of the present invention may include dividing each of a plurality of wafers into a plurality of multi-dies each including a plurality of dies (operation S10); checking whether each of the dies has a defect (operation S20); storing a result of checking whether each of the dies has a defect and information regarding each of the multi-dies (operation S30); forming virtual combined structures by combining and stacking all the multi-dies in a predetermined number of layers (operation S40); forming 3D semiconductor groups by calculating the yields of the combined structures, based on the result of checking whether each of the dies has a defect and the information regarding each of the multi-dies, selecting a combined structure having a highest yield, and stacking the multi-dies to have the same structure as the selected combined structure (operation S50); and forming a 3D semiconductor chip by dividing the 3D semiconductor groups in units of dies (operation S60).

To stack 3D semiconductors, each of a plurality of wafers is divided into a plurality of multi-dies each including a plurality of dies (operation S10).

The term "die" means a small tetragonal slice of a semiconductor material on which a circuit is formed. A plurality of dies may be arranged on one wafer. A multi-die may be understood as a group of a plurality of dies.

One wafer may be divided into a plurality of multi-dies using a plurality of dies arranged on the wafer. When a plurality of wafers are present, each of the wafers may be divided into a plurality of multi-dies using dies of each of the wafers. To separate the plurality of multi-dies from the plurality of wafers, scribing, mechanical sawing, laser cutting, etc. may be used.

A manner of separating the plurality of multi-dies from the plurality of wafers using dies may vary according to a purpose of manufacturing a 3D semiconductor chip. That is, the number of dies to be included in each of multi-dies and the size of each of the multi-dies may be determined by changing areas of groups into which the plurality of dies arranged on each of the wafers are divided. In this case, multi-dies may be separated from the plurality of wafers such that all dies arranged on one wafer are included in the multi-dies.

For example, each of the multi-dies separated from the wafers may have a top surface having a first corner extending in a first direction and a second corner extending in a second direction perpendicular to the first direction, and have a square shape, but the present invention is not limited thereto. For example, the multi-dies may have a rectangular shape.

For example, in the dividing of the plurality of wafers into the plurality of multi-dies (operation S10), the plurality of wafers may be divided to have the same number of dies and have the same shape. That is, a plurality of multi-dies divided from one wafer may have the same shape and size.

Alternatively, a plurality of multi-dies divided from one wafer may have at least one same shape. For example, when eight multi-dies are divided from one wafer, four multi-dies may have the same square shape and size having the same number of dies and the other four multi-dies may have the same rectangular shape and size having the same number of dies.

After the plurality of multi-dies are separated from the plurality of wafers, it is checked whether dies of each of the multi-dies have a defect (operation S20). For example, the location of at least one die having a defect may be marked on each of the multi-dies as a result of checking whether dies of each of the multi-dies have a defect.

Next, the result of checking whether dies of each of the multi-dies have a defect and information regarding each of the multi-dies are stored (operation S30). For example, the information regarding each of the multi-dies may include an identification (ID) number of a wafer from which each of the multi-dies is separated, and an ID number of a location on each of the wafer from which each of the multi-dies is separated.

For example, when the number of the wafers is 'N' and four multi-dies are separated from each of the wafers, '1' to 'N' may be assigned as ID numbers to the wafers and 'A' to 'D' may be assigned as ID numbers to the four multi-dies. Here, 'N' denotes a natural number that is equal to or greater than '3'.

In this case, 'A' to 'D' may be assigned as ID numbers to the four multi-dies separated from the wafer assigned '1' in a clockwise direction, starting from a left side of the top of the wafer assigned '1'. For example, the four multi-dies separated from the wafer assigned '1' may be indicated as, for example, a multi-die-1-A, a multi-die-1-B, a multi-die-1-C, and a multi-die-1-D, respectively. However, the present invention is not limited thereto and it would be apparent to those of ordinary skilled in the art that various methods may be used to indicate the multi-dies, provided that the multi-dies can be distinguished from one another.

Next, virtual combined structures are formed by combining and stacking all the multi-dies in a predetermined number of layers (operation S40). For example, when the predetermined number of layers is three, a combined structure may be formed by selecting a multi-die from among the multi-dies, stacking another multi-die on the selected multi-die, and stacking the other multi-die on the stacked multi-die. The forming of the combined structure may be performed using a computer program. The combined structure may be understood as a virtual combined structure that is not actually manufactured. The virtual combined structures may be formed based on the stored information regarding each of the multi-dies.

For example, three-layer combined structures may be formed by using all the multi-dies in various combinations. The using of the multi-dies in various combinations may be performed using a computer program.

Also, the stacking of all the multi-dies may be performed by arranging the multi-dies such that the first and second corners of the multi-dies are in parallel with each other. For example, when one multi-die, e.g., the multi-die-1-B, is stacked on another multi-die, e.g., the multi-die-1-A, cases in which the multi-die-1-B is stacked on the multi-die-1-A in a state in which the multi-die-1-B is rotated are excluded. This method is substantially the same as a stacking method employed in the wafer-to-wafer (W2W) method and is thus not described in detail here.

After all the virtual combined structures are each formed in the predetermined number of layers, 3D semiconductor groups are formed by calculating yields of the combined structures based on the result of checking whether dies of each of the multi-dies have a defect and the information regarding each of the multi-dies, selecting a combined structure having a highest yield from among the combined structures, and stacking the multi-dies to have the same structure as the selected combined structure (operation S50).

The predetermined number of layers is variable according to a user's selection, and may be set to 2, 4, 6, etc.

The yields of the combined structures may be calculated based on the information regarding the multi-dies on which the location of at least one die having a defect is marked. When the combined structure having the highest yield is selected from among the formed combined structures, the information regarding the multi-dies belonging to the combined structure having the highest yield may be also checked.

Next, a 3D semiconductor chip is formed by dividing the 3D semiconductor groups in units of dies (operation S60). In order to form the 3D semiconductor chip, the 3D semiconductor groups should be divided in units of dies by scribing, mechanical sawing, laser cutting, or the like. By performing the process described above, a 3D semiconductor chip may be formed.

When a method of manufacturing a 3D semiconductor chip according to an exemplary embodiment of the present invention is used, a 3D semiconductor chip having a highest yield and an improved throughput may be formed, as will be described in detail with reference to the accompanying drawings below.

Figure 2A:
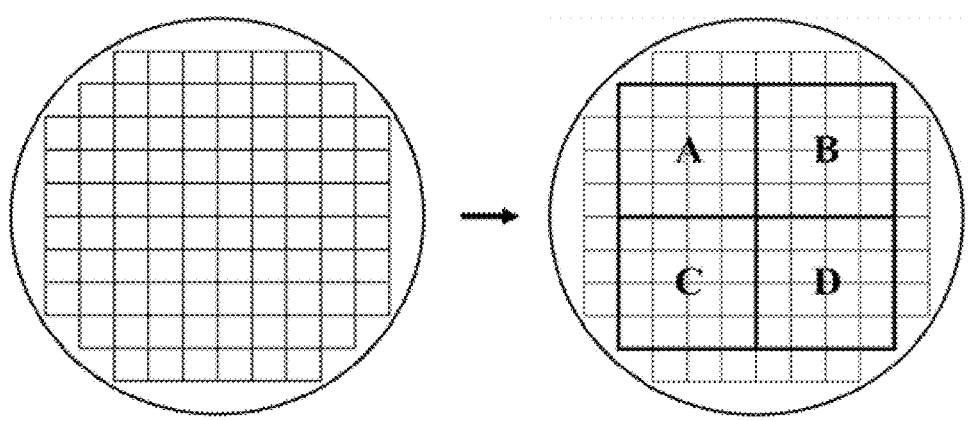
FIGS. 2A to 2C are diagrams illustrating methods of separating multi-dies from a wafer according to exemplary embodiments of the present invention.
Figure 2B:
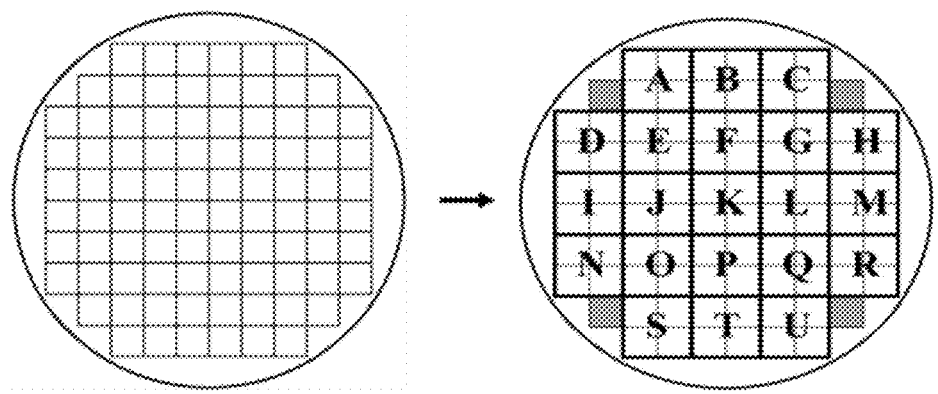
Figure 2C:
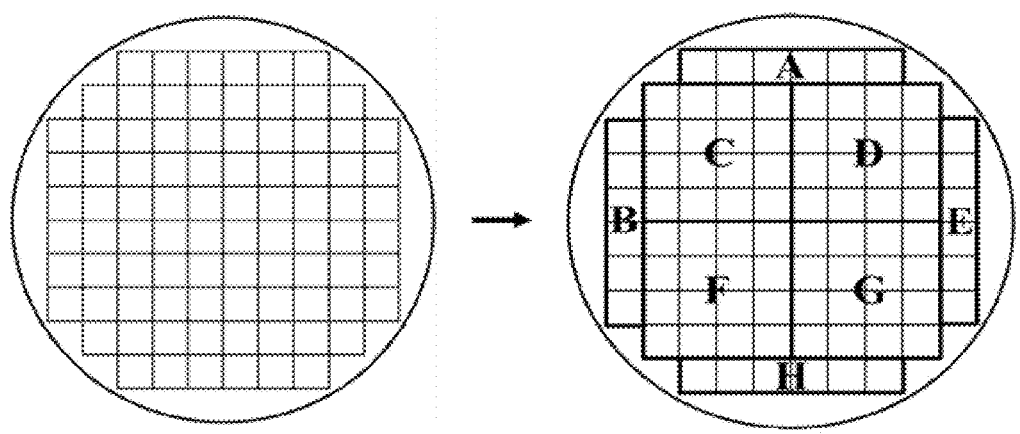

FIGS. 2A to 2C are diagrams illustrating methods of separating multi-dies from a wafer according to exemplary embodiments of the present invention.

Referring to FIG. 2A, four multi-dies A to D each including sixteen dies may be separated from one wafer. The multi-dies each have a square shape and a size of 4×4.

Referring to FIG. 2B, twenty-one multi-dies A to U each including four dies may be separated from one wafer. The multi-dies each have a square shape and a size of 2×2.

Here, shaded dies denote dies that are not included in the multi-dies, and may be used in a die-to-die (D2D) process.

Referring to FIG. 2C, eight multi-dies A to H may be separated from one wafer.

The four multi-dies A, B, E and H each have a rectangular shape and six dies having a size of 1×6 among the eight multi-dies A to H. The other four multi-dies C, D, F and G each have a square shape and sixteen dies having a size of 4×4.

As illustrated in FIG. 2C, multi-dies having a plurality of shapes may be separated from one wafer, and at least one of the shapes and sizes of the multi-dies is variable according to conditions (a yield, a throughput, etc.) of forming a 3D semiconductor chip.

Figure 3:
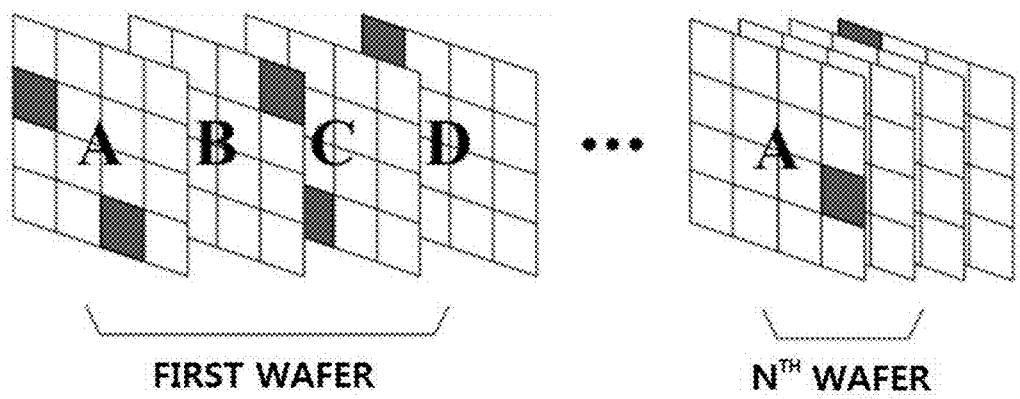
FIG. 3 is a diagram illustrating a method of storing information regarding multi-dies with defects in units of dies according to an exemplary embodiment of the present invention.

FIG. 3 is a diagram illustrating a method of storing information regarding multi-dies with defects in units of dies according to an exemplary embodiment of the present invention.

Referring to FIG. 3, the locations of dies with a defect are marked on four multi-dies separated from a first wafer. In this manner, information regarding each of the multi-dies may be stored in each of the multi-dies. Thus, virtual combined structures may be formed using the multi-dies storing the information regarding the defects.

Table 1 below shows the yield of a 3D semiconductor chip manufactured using a method of manufacturing a 3D semiconductor chip according to an exemplary embodiment of the present invention. In Table 1, multi-dies each have a size of 2×2, 3×3, or 4×4, 'T' denotes a number of tiers of each of combined structures in which multi-dies are stacked, and 'N' denotes the number of multi-dies separated from wafers.

TABLE 1

| Size of multi-die | T | N | Defect Rates 20% | 40% | 60% | 80% |
|---|---|---|---|---|---|---|
| 2 × 2 | 2 | 75 | 68.03% | 40.89% | 20.41% | 6.84% |
|  |  | 100 | 68.35% | 41.24% | 20.69% | 6.98% |
|  |  | 125 | 68.58% | 41.46% | 20.87% | 7.09% |
|  | 4 | 75 | 45.34% | 18.63% | 6.21% | 1.55% |
|  |  | 100 | 47.14% | 19.62% | 6.65% | 1.71% |
|  |  | 125 | 48.33% | 20.24% | 6.94% | 1.82% |
|  | 6 | 75 | 32.78% | 9.92% | 2.74% | 0.75% |
|  |  | 100 | 34.75% | 10.87% | 3.12% | 0.90% |
|  |  | 125 | 36.02% | 11.48% | 3.37% | 0.99% |
| 3 × 3 | 2 | 75 | 70.36% | 43.83% | 23.15% | 8.70% |
|  |  | 100 | 70.80% | 44.32% | 23.54% | 8.93% |
|  |  | 125 | 71.15% | 44.64% | 23.82% | 9.10% |
|  | 4 | 75 | 49.80% | 22.96% | 9.10% | 2.93% |
|  |  | 100 | 51.97% | 24.29% | 9.82% | 3.24% |
|  |  | 125 | 53.50% | 25.23% | 10.33% | 3.46% |
|  | 6 | 75 | 38.13% | 14.11% | 5.03% | 1.76% |
|  |  | 100 | 40.96% | 15.62% | 5.76% | 2.06% |
|  |  | 125 | 42.71% | 16.62% | 6.22% | 2.25% |
| 4 × 4 | 2 | 75 | 72.66% | 46.76% | 25.95% | 10.67% |
|  |  | 100 | 73.27% | 47.40% | 26.45% | 10.97% |
|  |  | 125 | 73.65% | 47.84% | 26.81% | 11.21% |
|  | 4 | 75 | 53.99% | 27.47% | 12.37% | 4.60% |
|  |  | 100 | 56.67% | 29.28% | 13.39% | 5.11% |
|  |  | 125 | 58.37% | 30.48% | 14.11% | 5.46% |
|  | 6 | 75 | 43.57% | 18.75% | 7.87% | 3.10% |
|  |  | 100 | 47.13% | 20.87% | 8.98% | 3.61% |
|  |  | 125 | 49.42% | 22.28% | 9.71% | 3.98% |

Referring to Table 1, the lower defect rates, the higher the yield of a virtual 3D semiconductor chip, and the greater the number of multi-dies separated from the wafers, the higher the yield of the virtual 3D semiconductor chip.

Also, the greater the size of a multi-die, the higher the yield of the 3D semiconductor chip. That is, the greater the number of dies included in a multi-die, the higher the yield of the 3D semiconductor chip.

Table 2 below shows the yield of a 3D semiconductor chip stacked using a W2W method according to the related art. In Table 2, 'T' denotes a number of tiers of a 3D semiconductor chip in which wafers are stacked, and 'N' denotes the number of wafers.

TABLE 2

| T | N | \multicolumn{4}{c}{Defect Rates} |
| | | 20% | 40% | 60% | 80% |
|---|-----|--------|--------|--------|-------|
| 2 | 75  | 65.72% | 38.08% | 17.84% | 5.15% |
|   | 100 | 65.93% | 38.28% | 18.01% | 5.22% |
|   | 125 | 66.05% | 38.39% | 18.08% | 5.28% |
| 4 | 75  | 41.44% | 14.84% | 3.82%  | 0.59% |
|   | 100 | 42.69% | 15.34% | 4.03%  | 0.64% |
|   | 125 | 43.37% | 15.75% | 4.19%  | 0.69% |
| 6 | 75  | 27.94% | 6.37%  | 1.11%  | 0.16% |
|   | 100 | 29.03% | 6.87%  | 1.26%  | 0.21% |
|   | 125 | 30.21% | 7.14%  | 1.36%  | 0.23% |

In Table 2, when the number of tiers of the 3D semiconductor chip is '6' and the number of wafers stacked to form the 3D semiconductor chips is '125', the yield of the 3D semiconductor chip is 30.21%.

In Table 1, the number of tiers of a 3D semiconductor chip is '6' when multi-dies have a size of 4×4, and the yield of the 3D semiconductor chip is 49.42% when the number of stacked multi-dies is '125'. The yield of a 3D semiconductor chip manufactured according to an exemplary embodiment of the present invention is higher by about 46% than the yield of a 3D semiconductor chip manufactured using the W2W method.

Figure 4:
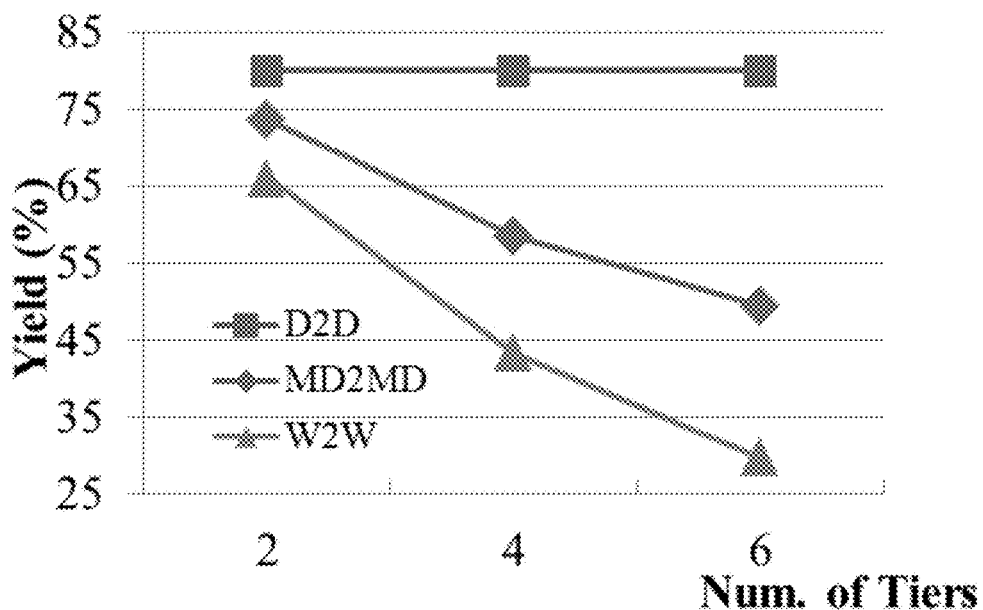
FIG. 4 is a graph showing the yield of a 3D semiconductor chip manufactured using a method of manufacturing a 3D semiconductor chip according to an exemplary embodiment of the present invention.

FIG. 4 is a graph showing the yield of a 3D semiconductor chip manufactured using a method of manufacturing a 3D semiconductor chip according to an exemplary embodiment of the present invention.

In FIG. 4, "D2D" denotes a 3D semiconductor chip manufactured using a D2D method according to the related art, "MD2MD" (multi-die-to-multi-die) denotes a 3D semiconductor chip manufactured using the method of manufacturing a 3D semiconductor chip according to an embodiment of the present invention, and "W2W" denotes a 3D semiconductor chip manufactured using the W2W method according to the related art.

Referring to FIG. 4, even when the number of stacked layers increases, the yield of the 3D semiconductor chip MD2MD is higher than that of the 3D semiconductor chip W2W. Thus, the yield of the 3D semiconductor chip manufactured using the method of manufacturing a 3D semiconductor chip according to an exemplary embodiment of the present invention is higher than that of the W2W method according to the related art.

Figure 5:
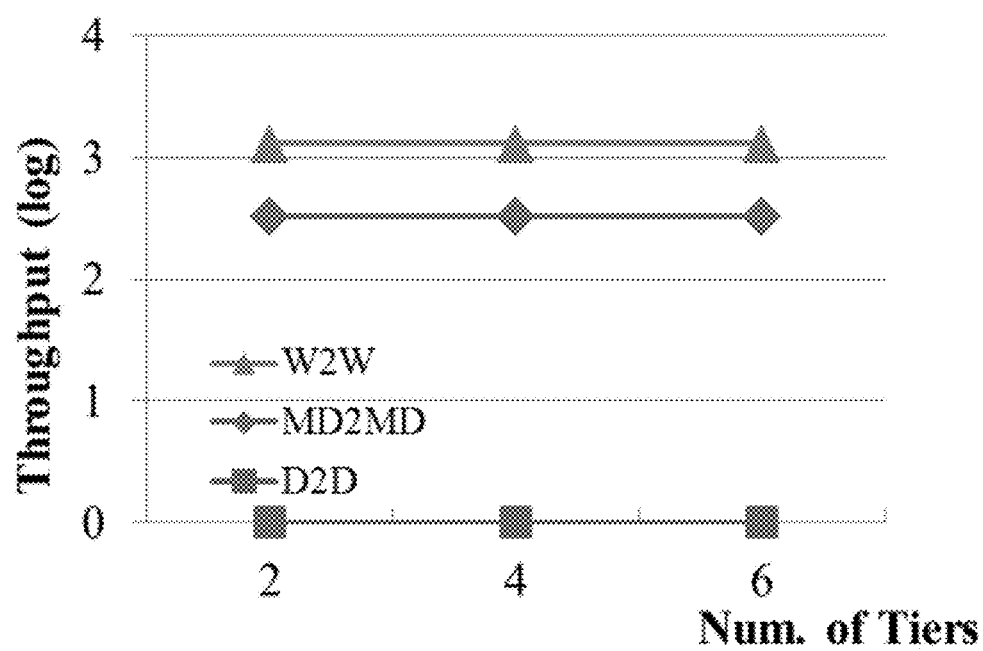
FIG. 5 is a graph showing the throughput of a 3D semiconductor chip manufactured using a method of manufacturing a 3D semiconductor chip according to an exemplary embodiment of the present invention.

FIG. 5 is a graph showing the throughput of a 3D semiconductor chip manufactured using a method of manufacturing a 3D semiconductor chip according to an exemplary embodiment of the present invention.

In FIG. 5, "D2D" denotes a 3D semiconductor chip manufactured using the D2D method according to the related art, "MD2MD" denotes a 3D semiconductor chip manufactured using the method of manufacturing a 3D semiconductor chip according to an exemplary embodiment of the present invention, and "W2W" denotes a 3D semiconductor chip manufactured using the W2W method according to the related art.

Referring to FIG. 5, even when the number of stacked layers increases, the throughput of the 3D semiconductor chip MD2MD is higher than that of the 3D semiconductor chip D2D. Thus, the throughput of the 3D semiconductor chip manufactured using the method of manufacturing a 3D semiconductor chip according to an exemplary embodiment of the present invention is higher than that of the D2D method according to the related art.

As described above with reference to FIGS. 4 and 5, a 3D semiconductor chip manufactured using the method of manufacturing a 3D semiconductor chip according to an exemplary embodiment of the present invention has a higher yield than that of a 3D semiconductor chip manufactured using the W2W method according to the related art, and has a higher throughput than that of a 3D semiconductor chip manufactured using the D2D method according to the related art. Thus, the method of manufacturing a 3D semiconductor chip according to an exemplary embodiment of the present invention has advantages of both the W2W method and the D2D method according to the related art.

As described above, according to an embodiment of the present invention, the throughput and yield of a method of manufacturing a 3D semiconductor chip may be improved. That is, the method of manufacturing a 3D semiconductor chip according to the present invention may have a higher yield than that of the W2W method according to the related art and have a higher throughput than that of the D2D method according to the related art.

It will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

What is claimed is:

1. A method of manufacturing a three-dimensional (3D) semiconductor chip, the method comprising:
dividing each of a plurality of wafers into a plurality of multi-dies each including a plurality of dies;
checking whether each of the dies has a defect;
storing a result of checking whether each of the dies has a defect and information regarding each of the multi-dies;
forming virtual combined structures by combining and stacking all the multi-dies in a predetermined number of layers;
forming 3D semiconductor groups by calculating yields of the combined structures based on the result of checking whether each of the dies has a defect and the information regarding each of the multi-dies, selecting a combined structure having a highest yield from among the combined structures, and stacking the multi-dies to have the same structure as the selected combined structure; and
forming a 3D semiconductor chip by dividing the 3D semiconductor groups in units of dies.

2. The method of claim 1, wherein the multi-dies each have a tetragonal shape and a top surface,
wherein the top surface includes a first corner extending in a first direction and a second corner extending in a second direction perpendicular to the first direction.

3. The method of claim 2, wherein the multi-dies are stacked such that the first and second corners of the multi-dies are arranged to be parallel to each other.

4. The method of claim 1, wherein the dividing of each of the plurality of wafers into the plurality of multi-dies comprises dividing each of the plurality of wafers such that the multi-dies have the same number of dies and the same shape and size.

5. The method of claim 1, wherein a location of at least one die with a defect is marked on each of the multi-dies as the result of checking whether each of the dies has a defect.

6. The method of claim 1, wherein the information regarding each of the multi-dies comprises:

an identification number of a wafer from which each of the plurality of multi-dies is separated; and an identification number of a location on the wafer from which each of the multi-dies is separated.

7. The method of claim 1, wherein a number of the plurality of multi-dies divided from each of the plurality of wafers is four or more.

8. The method of claim 1, wherein the predetermined number of layers is two or more.

* * * * *